(12) United States Patent
Takahi et al.

(10) Patent No.: US 7,755,085 B2
(45) Date of Patent: Jul. 13, 2010

(54) SEMICONDUCTOR DEVICE AND METHOD FOR FABRICATING SAME

(75) Inventors: Mitsuhiro Takahi, Fukuyama (JP); Kazuhiro Moritani, Kasaoka (JP)

(73) Assignee: Sharp Kabushiki Kaisha, Osaka (JP)

( * ) Notice: Subject to any disclaimer, the term of this patent is extended or adjusted under 35 U.S.C. 154(b) by 149 days.

(21) Appl. No.: 11/914,268

(22) PCT Filed: May 10, 2006

(86) PCT No.: PCT/JP2006/309408

§ 371 (c)(1), (2), (4) Date: Nov. 13, 2007

(87) PCT Pub. No.: WO2006/121082

PCT Pub. Date: Nov. 16, 2006

(65) Prior Publication Data

US 2009/0102024 A1    Apr. 23, 2009

(30) Foreign Application Priority Data

May 13, 2005  (JP) .............................. 2005-141011

(51) Int. Cl.
*H01L 29/04* (2006.01)

(52) U.S. Cl. .................... 257/49; 257/629; 257/913; 257/E21.318

(58) Field of Classification Search .................. 257/49, 257/66, 75, 629, 777, 913, E29.005, E21.318; 438/471
See application file for complete search history.

(56) References Cited

U.S. PATENT DOCUMENTS 5,063,113 A * 11/1991 Wada .......................... 428/446

(Continued)

FOREIGN PATENT DOCUMENTS

EP    1 229 582    8/2002

(Continued)

OTHER PUBLICATIONS

International Search Report mailed Aug. 8, 2006.

(Continued)

*Primary Examiner*—Tuan N. Quach
(74) *Attorney, Agent, or Firm*—Nixon & Vanderhye P.C.

(57) ABSTRACT

A semiconductor device has an IC chip with a thickness of equal to or less than 100 μm and includes a semiconductor substrate. A device forming region is within the depth of approximately equal to or less than 5 μm from a surface of the semiconductor substrate, and a total thickness of the semiconductor substrate is from 5 μm to 100 μm. A BMD layer for carrying out gettering of metal impurities is provided immediately under the device forming region. Since a gettering site is provided immediately under the device forming region, in a device or the like of which extreme thinness is required, degradation of device characteristics and reliability due to contamination of metal impurities can be prevented, and stabilize and improve the device yield. The present invention inhibits degradation of device characteristics and reliability caused by contamination of metal impurities, in a device of which lamination of device chips is required or in a device of which extreme chip thinness for an IC card and the like is required, in an attempt to cope with an enlarged capacity of the device.

9 Claims, 8 Drawing Sheets

U.S. PATENT DOCUMENTS

| | | |
|---|---|---|
| 2002/0038821 A1* | 4/2002 | Sanemitsu ................ 235/492 |
| 2002/0038905 A1* | 4/2002 | Sugizaki .................. 257/678 |
| 2002/0100941 A1 | 8/2002 | Yonehara et al. |
| 2004/0180512 A1 | 9/2004 | Linn et al. |
| 2004/0194692 A1 | 10/2004 | Nishikawa et al. |

FOREIGN PATENT DOCUMENTS

| | | |
|---|---|---|
| JP | 4-43646 A | 2/1992 |
| JP | 4-180628 | 6/1992 |
| JP | 4-180628 A | 6/1992 |
| JP | 7-29911 | 1/1995 |
| JP | 7-29911 A | 1/1995 |
| JP | 11-297976 | 10/1999 |
| JP | 2002-231909 | 8/2002 |
| KR | 1999-0082954 | 11/1999 |

OTHER PUBLICATIONS

Written Opinion of the ISR and Translation mailed Aug. 8, 2006.

* cited by examiner

Flow of forming Si distortion of gettering site immediately under device forming region by ion implantation

| Ion implantation | Ion seeds: Ar⁺<br>Implantation energy: 5MeV<br>Amount of Implantation: 5E+15/cm² |

| Heat treatment | Atmosphere: $N_2$<br>Temperature: 900°C<br>Time: 30 minutes |

SEMICONDUCTOR DEVICE AND METHOD FOR FABRICATING SAME

This application is the U.S. national phase of International Application No. PCT/JP2006/309408 filed 10 May 2006 which designated the U.S. and claims priority to JP 2005-141011 filed 13 May 2005, the entire contents of each of which are hereby incorporated by reference.

TECHNICAL FIELD

The present invention generally relates to semiconductor devices, and more particularly to a semiconductor device improved to inhibit degradation of device characteristics and decrease in reliability which are caused by contamination of metal impurities, in a device wherein thin device chips and extreme thin chip for an IC card are required, in order to correspond to an enlarged capacity of the device.

BACKGROUND ART

In the fabrication of semiconductor devices, in order to stabilize and improve the yield of the devices, it is required to inhibit degradation of the characteristics and reliability of the devices. Factors of degradation of the characteristics and reliability of the devices include an increase in leak current caused by occurrence of crystal defect and degradation of the film quality of the gate oxide film, which are based on contamination of metal impurities.

As a measure against contamination of metal impurities, such a method is employed that forms a gettering site for metal impurities on a silicon semiconductor substrate constituting a semiconductor device. As this method, IG (Intrinsic Getter) method and EG (Extrinsic Getter) method have been conventionally well known.

The IG method is such a method that by subjecting the silicon semiconductor substrate to high-temperature heat treatment, oxygen on the surface of the silicon semiconductor substrate is diffused outwardly to form a non-crystalline defect layer (DZ layer: Denuded Zone) that is possibly to be a device forming region as well as forming, further inward of the substrate than the DZ layer, a BMD (Bulk Micro Defect) made of an oxygen precipitates as a gettering site.

The EG method is such a method that by introducing lattice distortion or defect on the back surface of the silicon semiconductor substrate, gettering of metal impurities is carried out. As a representative example, such a method is known that a gettering site is formed by providing mechanical damage by sand blasting, by causing a lattice misfit dislocation to occur by diffusing impurities such as phosphorus, or by forming a polysilicon film.

Now, also in a device required to have laminated device chips and extremely thin chips in the IC card and the like, a gettering site for metal impurities needs to be formed.

Figure 11:
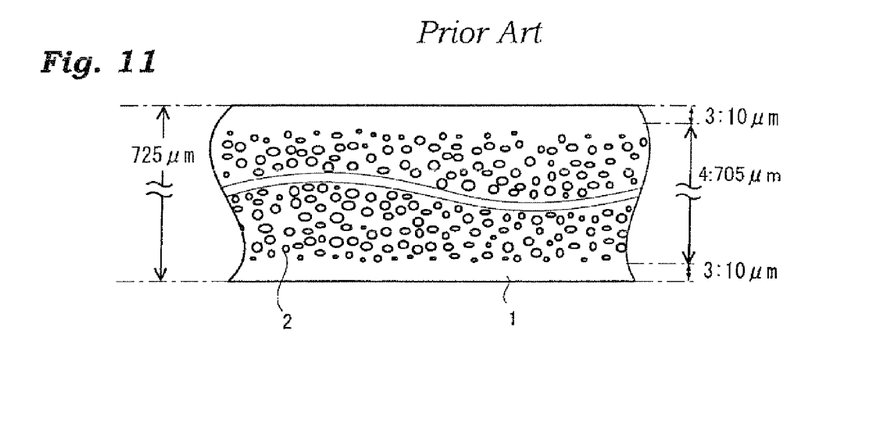
FIG. 11 is a cross sectional view of a substrate obtained by the conventional IG method.

FIG. 11 shows a relationship between a DZ layer 3 and a BMD layer 4 of a conventional, 725-μm thick silicon semiconductor substrate 1 that is subjected to IG processing. Even in the case of forming the device forming region within the depth of approximately 5 μm from the surface of the silicon semiconductor substrate 1, by the IG method, the DZ layer 3 in the silicon semiconductor substrate 1 is formed to have a width of equal to or more than 10 μm. When the IC chip is thick (e.g., the thickness of the silicon semiconductor substrate 1 being 725 μm), if the number of the BMD 2 formed in the silicon semiconductor substrate 1 is approximately $1 \times 10^5/cm^2$ (hereinafter abbreviated as 1E+05, this abbreviation on the basis of the assumption that $m \times 10^n$ is denoted as mE+n being used in examples described below), then a sufficient ability of gettering of metal impurities is possessed.

However, when, due to lamination of device chips and in IC cards and the like, the IC chip is as extremely thin as equal to or less than 100 μm, then the number of the BMD 2 in the silicon semiconductor substrate is significantly smaller than when the IC chip is thick.

Figure 12:
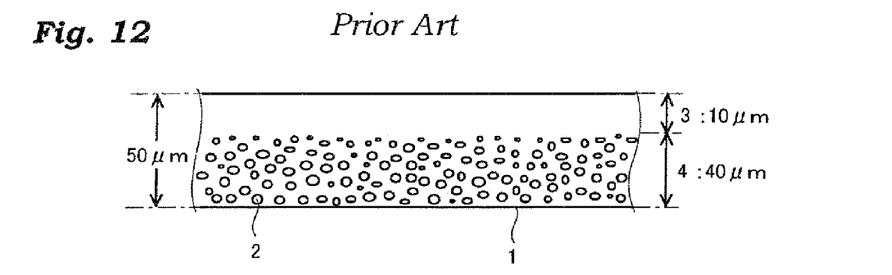
FIG. 12 is a cross sectional view of an extremely thin substrate obtained by the conventional IG method.

FIG. 12 shows a relationship between the DZ layer 3 and the BMD layer 4 in the case of processing the silicon semiconductor substrate 1 to 50 μm thick to fabricate an IC chip of as extremely thin as 50 μm. In the silicon semiconductor substrates 1 shown in FIGS. 11 and 12 for comparison, when proportional calculations for the number of the BMD 2 are carried out on the basis of the thicknesses of the BMD layers 4, the number of the is BMD 2 in the case of the 50-μm thickness (the forming region in the BMD 2 being 40 μm) is as small as 6% of that in the case of 725-μm thickness (the forming region in the BMD being 705 μm).

Figure 13:
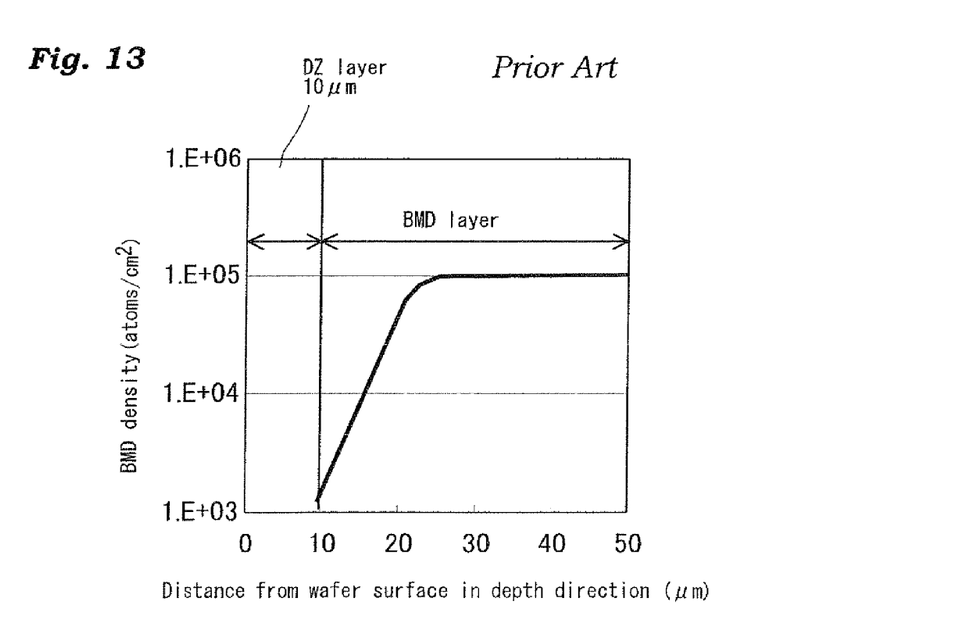
FIG. 13 is a diagram showing the distribution of BMD in the substrate depth direction of an extremely thin substrate obtained by the conventional IG method.

FIG. 13 shows, in the silicon semiconductor substrate 1 shown in FIG. 12, the distribution of the number of the BMD 2 in the depth direction from the substrate surface. As shown in FIG. 13, the BMD is formed from the depth of 10 μm, and the number of the BMD is small in the depth of from 10 to 20 μm. It is from the depth of from 20 to 30 μm from the surface that $1E+05/cm^2$ is reached, where a sufficient ability of gettering is possessed.

The gettering ability of metal impurities depends on the number of the BMD 2. An extremely thinner IC chip is more largely affected by the width of the DZ layer 3. That is, as the width of the DZ layer 3 becomes larger, the number of the BMD 2 becomes smaller, thus largely reducing the gettering ability of metal impurities.

Figure 14:
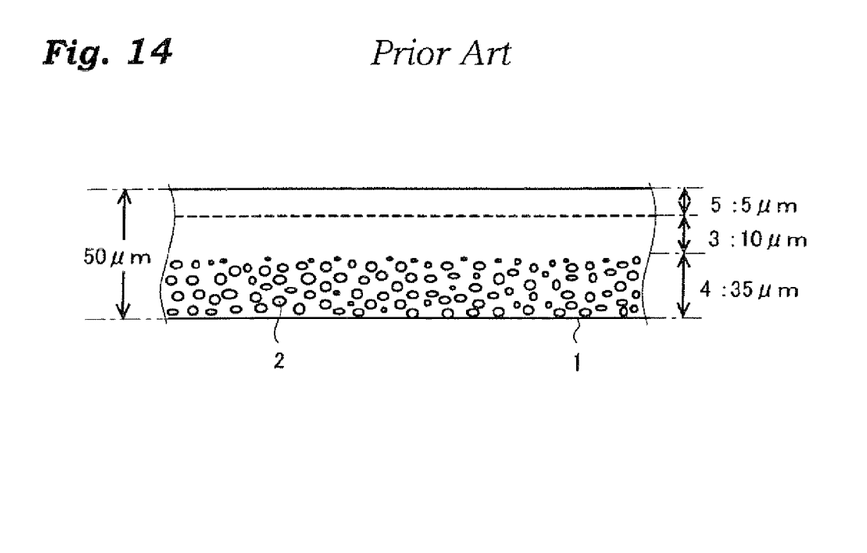
FIG. 14 is a cross sectional view of an extremely thin substrate obtained by epitaxial-growing of Si on a substrate obtained by the conventional IG method.

FIG. 14 shows a relationship between the DZ layer 3 and the BMD layer 4 in the case of forming a 5-μm epitaxial Si layer 5 as a device forming region in the silicon semiconductor substrate 1 of an IC chip of as extremely thin as 50 μm. Referring to FIG. 14, when the Si layer 5, which is a non-crystalline defect layer, is epitaxial-grown as a device forming region on a silicon semiconductor substrate where the thickness of the DZ layer 3 is equal to or more than 10 μm, then the thickness of the epitaxial-grown Si layer 5 is added, and thus the use of an extremely thin IC chip further decreases the number of the BMD 2 compared with the case where the epitaxial Si layer 5 is not grown.

Figure 15:
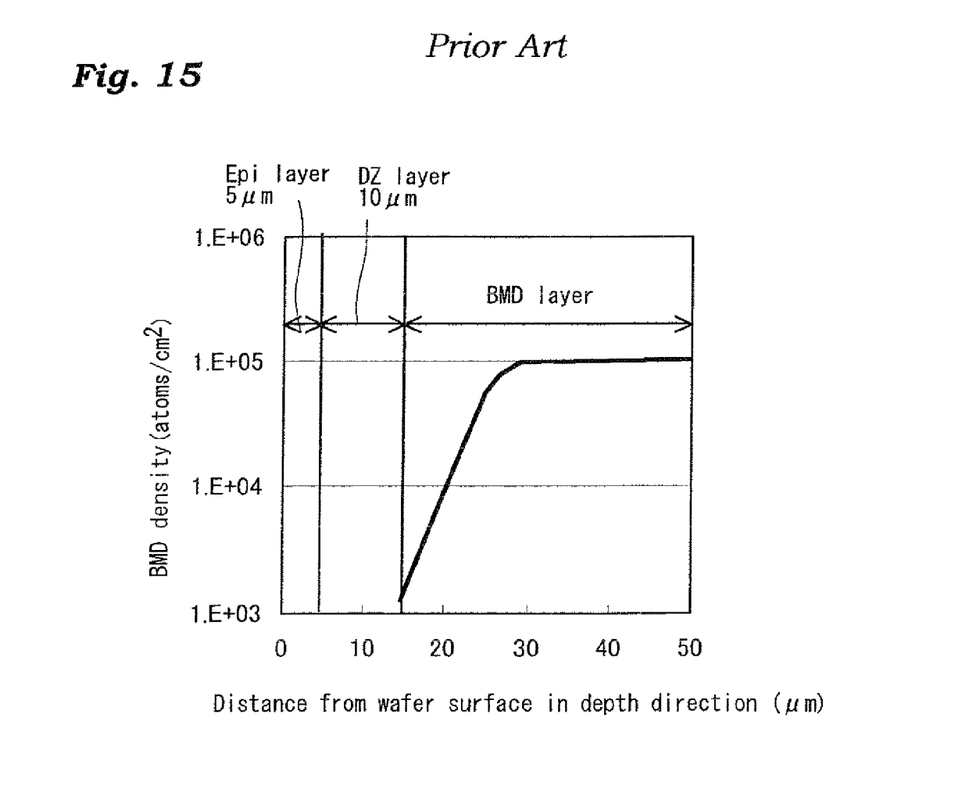
FIG. 15 is a diagram showing the distribution of BMD in the extremely thin substrate obtained by epitaxial-growing of Si on a substrate obtained by the conventional IG method.

FIG. 15 shows the distribution of the number of the BMD in FIG. 14 in the depth direction from the substrate surface. As shown in FIG. 15, compared with the case of not growing the epitaxial Si layer 5, the point where formation of the BMD 2 starts is deeper by the degree equivalent to the thickness of the epitaxial Si layer 5; consequently, the BMD starts being formed from the depth of 15 μm. In the depth of from 15 to 25 μm, the number of the BMD is small, and it is from the depth of from 25 to 35 μm from the surface that the number of the BMD reaches $1E+05/cm^2$, where a sufficient ability of gettering is possessed. The number of the BMD is approximately 15% smaller than that in the case of not growing the epitaxial Si layer 5.

Figure 16:
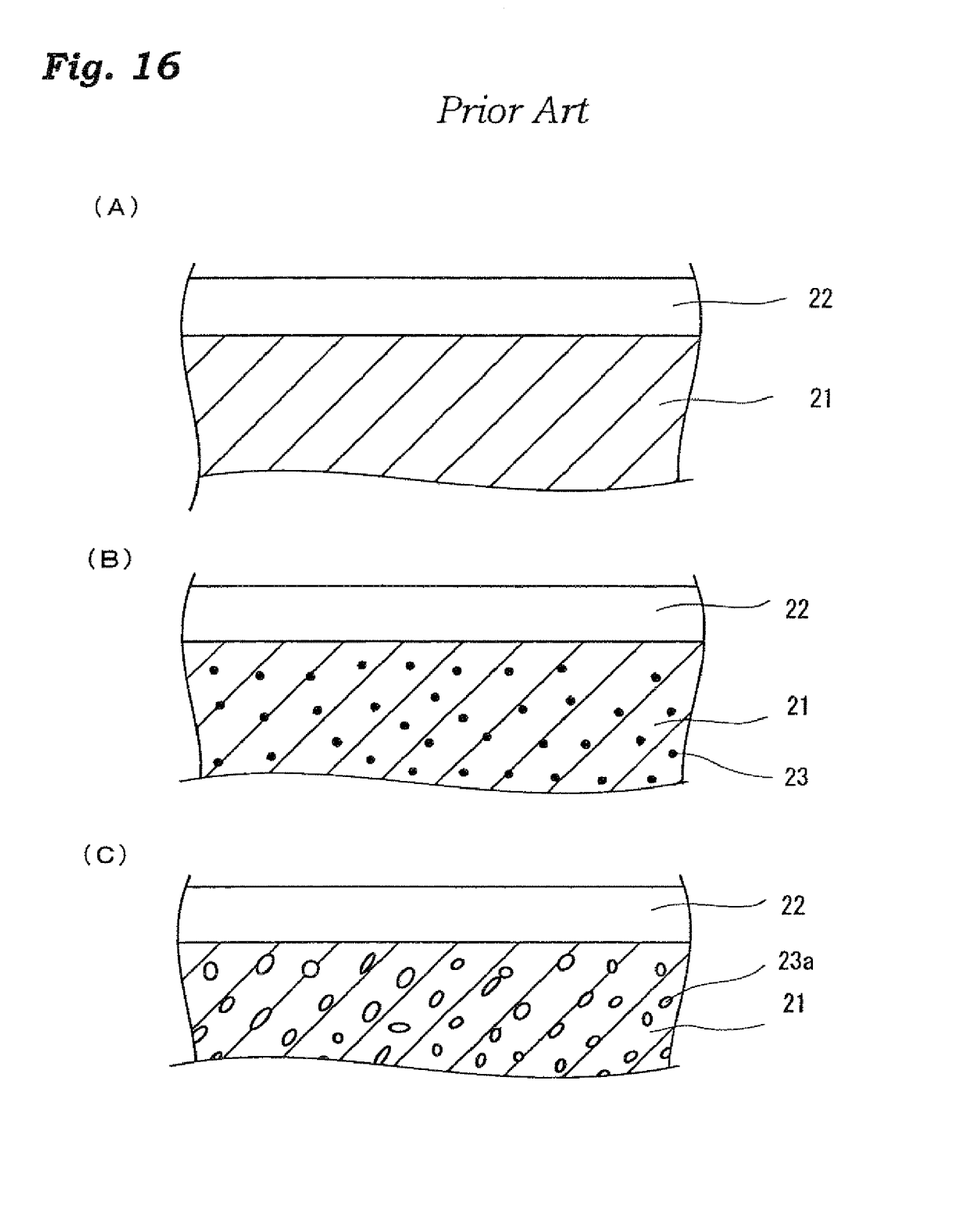
FIGS. 16(a) to 16(c) are a cross sectional view of a semiconductor device according to a conventional example for showing its fabrication process.

A method is known (see, for example, patent document 1) such that referring to FIG. 16(A), a Si layer 22 is epitaxial-grown on a silicon semiconductor substrate 21, after which, referring to FIG. 16(B), heat treatment is carried out to form an oxygen precipitates 23. Referring to 16(C), heat treatment is further carried out to make a BMD 23a inside the silicon semiconductor substrate 21. In this method, however, oxygen on the surface of the silicon semiconductor substrate 21 under the epitaxial Si layer 22 is externally diffused, after which a non-crystalline defect region is formed, and thus the use of an extremely thin IC chip further decreases the number of the BMD 23a.

In the EG method, if the IC chip is as extremely thin as equal to or less than 100 μm, it is difficult in terms of strength to introduce lattice distortion or defect on the back surface. If the back surface of the silicon semiconductor substrate is subjected to mechanical grinding, the back surface becomes rough, which leads to introduction of defect to generate the EG effect of gettering of metal impurities. However, if the silicon semiconductor substrate becomes extremely thin, the bending strength of the substrate becomes weak, and thus if the back surface is rough, the substrate becomes easy to crack. In order to enhance the bending strength and prevent cracking, the back surface of the silicon semiconductor substrate needs to be processed into mirror. However, mirror processing eliminates the EG effect of gettering of metal impurities, which leads to, due to contamination of metal impurities, degradation of device characteristics and reliability.

Patent document 1: Japanese Patent Application Publication No. 4-43646.

DISCLOSURE OF THE INVENTION

In an aspect of the present invention, a method is provided for fabricating a semiconductor device having the function of gettering of metal impurities even when the IC chip is made extremely thin.

In another aspect, a method is for fabricating a semiconductor device improved to stabilize and improve the device yield.

In a further aspect, a semiconductor device is provided that is improved to degradation of device characteristics and reliability due to contamination of metal impurities.

A semiconductor device according to an embodiment of the present invention has an IC chip with a thickness of equal to or less than 100 μm and includes a semiconductor substrate. A device forming region is within the depth of approximately equal to or less than 5 μm from a surface of the semiconductor substrate, and a total thickness of the semiconductor substrate is from 5 μm to 100 μm. A gettering site for carrying out gettering of metal impurities is provided immediately under the device forming region. In this specification, the "surface" that serves as the basis of denoting the distance in the thickness direction refers to the surface of the semiconductor substrate. For example, the depth of 5 μm from the "surface" means the depth of 5 μm from the surface of the semiconductor substrate, and excludes the thicknesses of wiring lines, an interlayer films, a passivation film, and the like, which are formed on the semiconductor substrate in the IC chip fabrication. The multilayer wiring technique of the semiconductor process covers a wide range of techniques, and therefore the thicknesses of wiring lines, an interlayer film, a passivation film, and the like cannot be expressed in numerically unique values. Thus, the surface of the IC chip should not serve as the basis, and therefore the surface of the semiconductor substrate serves as the base surface. This applies to the description in the following.

Preferably, the gettering site is formed of a bulk micro defect, a crystal distortion, or an impurity of a conductive type opposite to that of the device.

A method according to another aspect of the present invention is drawn to a method for fabricating a semiconductor device having an IC chip with a thickness of equal to or less than 100 μm. The method includes steps of: preparing a silicon semiconductor substrate with a thickness of equal to or less than 95 μm, wherein bulk micro defects are formed up to the surface of the silicon semiconductor substrate; and epitaxial-growing a silicon layer with a thickness of approximately 5 μm on the silicon semiconductor substrate. The "surface" refers to the surface of the silicon semiconductor substrate.

A method according to another aspect of the present invention is drawn to a method for fabricating a semiconductor device having an IC chip with a thickness of equal to or less than 100 μm. The method includes steps of: preparing a silicon semiconductor substrate with a thickness of equal to or less than 95 μm, wherein bulk micro defects are formed up to the surface of the silicon semiconductor substrate; and sticking a silicon substrate with a thickness of approximately 5 μm on the silicon semiconductor substrate. The "surface" refers to the surface of the silicon semiconductor substrate.

A method according to another aspect of the present invention is drawn to a method for fabricating a semiconductor device having an IC chip with a thickness of equal to or less than 100 μm. The method includes forming a gettering site for gettering of a metal impurity at the depth of approximately 5 μm from a surface of a semiconductor substrate.

According to a preferred embodiment of the present invention, the formation of the gettering site is carried out by providing a Si crystal distortion formed by ion plantation at the depth of approximately 5 μm from the surface of the semiconductor substrate. This method is preferably realized by forming a Si crystal distortion by ion plantation in the vicinity of a surface of a silicon semiconductor substrate with a thickness of equal to or less than 95 μm and epitaxial-growing a silicon layer with a thickness of approximately 5 μm on the silicon semiconductor substrate. Alternatively, this method may be realized by forming a Si crystal distortion by ion plantation in the vicinity of a surface of a silicon semiconductor substrate with a thickness of equal to or less than 95 μm and sticking a silicon substrate with a thickness of approximately 5 μm on the silicon semiconductor substrate.

According to still another embodiment of the present invention, the formation of the gettering site is carried out by providing a Si crystal distortion formed by laser radiation at the depth of approximately 5 μm from the surface of the semiconductor substrate. This method is preferably realized by forming a Si crystal distortion by laser radiation in the vicinity of the surface of a silicon semiconductor substrate with a thickness of equal to or less than 95 μm and epitaxial-growing a silicon layer with a thickness of approximately 5 μm on the silicon semiconductor substrate. Alternatively, this method may be realized by forming a Si crystal distortion by laser radiation in the vicinity of the surface of a silicon semiconductor substrate with a thickness of equal to or less than 95 μm and sticking a silicon substrate with a thickness of approximately 5 μm on the silicon semiconductor substrate.

According to still another embodiment of the present invention, the formation of the gettering site is carried out by implanting an impurity of a conductive type opposite to that of the device at the depth of approximately 5 μm from the surface of the semiconductor substrate thereby forming a potential barrier to serve as the gettering site.

An IC card according to another aspect of the present invention has an IC chip with a thickness of equal to or less than 100 μm and includes a semiconductor substrate. A device forming region is within the depth of approximately equal to or less than 5 μm from a surface of the semiconductor substrate, and a total thickness of the semiconductor substrate is from 5 μm to 100 μm. A gettering site for carrying out gettering of metal impurities is provided immediately under the device forming region.

According to one or more aspects of the present invention, since the gettering site is provided immediately under the device forming region, in any devices such as a device of which thin device chips is required and a device of which extreme thinness of device chips for an IC card and the like is required, degradation of device characteristics and reliability caused by contamination of metal impurities can be inhibited, which leads to stability and improvement of the yield of devices.

REFERENCE NUMERAL

1 Silicon semiconductor substrate
2 BMD
3 DZ layer
4 BMD layer
5 Epitaxial Si layer
6 Source/drain
7 Device isolation region
8 Gate electrode
9 Interlayer insulation film
10 Metal wiring line
11 Passivation film
12, 13 Crystal distortion by ion implantation
14, 15 Crystal distortion by laser radiation
16 N-type impurity diffusion layer
21 Silicon semiconductor substrate
22 Epitaxial Si layer
23, 23a BMD

DETAILED DESCRIPTION

An aspect of the invention relates to a method for fabricating a semiconductor device having an IC chip with a thickness substantially ranging from 50 μm to 100 μm, more preferably substantially equal to or less than 50 μm. According to the aspect, to deal with minuteness of the device (element), a low-temperature process is carried out; the device is formed in a region within the depth of approximately 5 μm from the surface of the semiconductor substrate. The aspect is characterized in that a gettering site for gettering of metal impurities is formed immediately under the device forming region, i.e., at the depth of approximately 5 μm from the surface of the semiconductor substrate.

As an example method for forming the gettering site for metal impurities, the following steps can be employed.

1) A silicon semiconductor substrate is prepared in which BMD, which are oxygen precipitates, is formed up to the substrate surface in the wafer fabrication. On the silicon semiconductor substrate, an epitaxial Si is grown or a silicon substrate is stuck to serve as a device forming region, thereby forming a gettering site immediately under the device forming region.

2) A high-energy ion plantation of an inactive element such as Ar or a YAG laser radiation with a high absorption coefficient with respect to Si is carried out to the silicon semiconductor substrate, thereby forming a crystal distortion to serve as the gettering site immediately under the device forming region. On the silicon semiconductor substrate on which the crystal distortion is formed by the ion plantation or YAG laser radiation, an epitaxial Si is grown or a silicon substrate is stuck to serve as a device forming region, thereby forming a gettering site immediately under the device forming region.

3) A high-energy ion plantation of an impurity of a conductive type different from that of the device is carried out to the silicon semiconductor substrate, thereby forming a potential barrier to serve as a gettering site immediately under the device forming region.

Examples will be described in detail below with reference to the drawings.

EXAMPLE 1

Example 1 relates to a method for forming BMD of oxygen precipitates to serve as a gettering site for metal impurities immediately under a device forming region.

Figure 1:
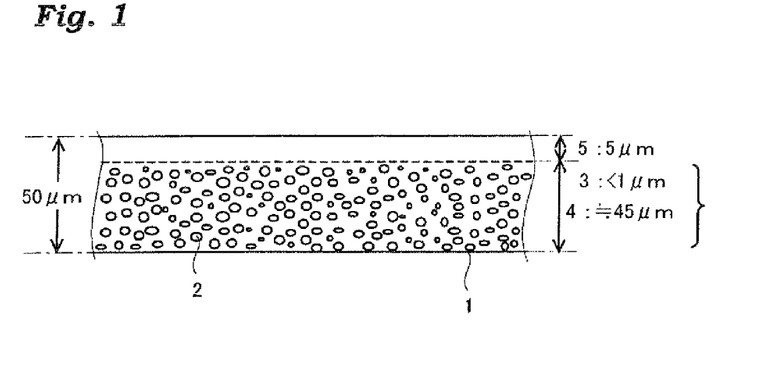
FIG. 1 is a cross sectional view of an extremely thin substrate according to example 1 obtained by an exemplary IG method.

Referring to FIG. 1, a silicon semiconductor substrate 1 is prepared in which a BMD 2 is formed up to the substrate surface (so that the thickness of a DZ layer is equal to or less than 1 μm) by adjusting the speed of pulling up an ingot Si crystal to serve as the semiconductor substrate and the temperature distribution of the pulling up furnace. On the silicon semiconductor substrate 1, a 5-μm thick epitaxial Si layer 5 to serve as a device forming region is formed by heat treatment of 1200° C. In this case, it is preferable that prior to formation of the epitaxial Si layer 5, the silicon semiconductor substrate 1 is subjected to heat treatment to shrink the BMD 2, thereby preventing crystal dislocation that occurs during growth of the epitaxial Si layer 5. This makes the number of the BMD 2 $1E+05/cm^2$ formed immediately under the epitaxial Si layer 5. The thickness of the BMD layer 4 becomes approximately 45 µm. This enables it to form an IC chip of as extremely thin as 50 µm.

Figure 2:
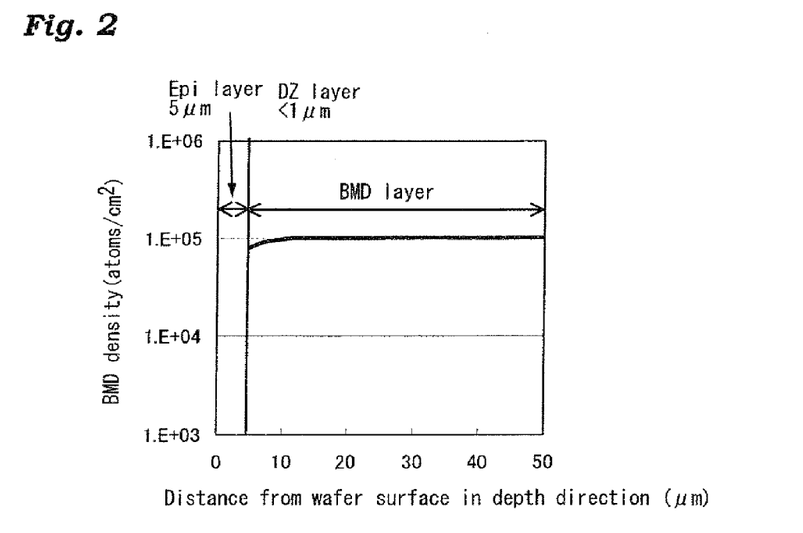
FIG. 2 is a diagram showing the distribution of BMD in the substrate depth direction of the extremely thin substrate according to example 1.

FIG. 2 shows, in the semiconductor substrate obtained in the above method, the distribution of the number of the BMD in the depth direction from the substrate surface. The BMD 2 is formed in the number $1E+05/cm^2$, which provides a sufficient gettering ability, from the depth of 5 µm immediately under the epitaxial Si layer 5. The number of the BMD 2 is increased by 50% or more compared with the case of forming a 5-µm thick epitaxial Si layer by the conventional method (FIG. 14).

If a silicon substrate is stuck on the silicon substrate instead of growing the epitaxial Si layer 5 on the silicon substrate, the gettering site can be formed immediately under the device forming region.

Figure 3:
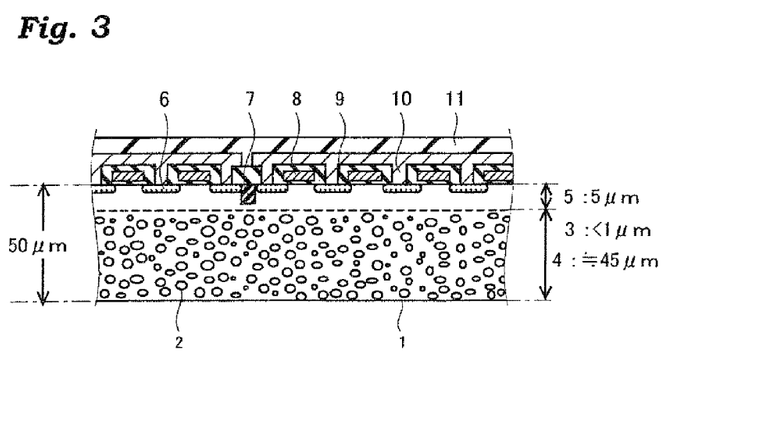
FIG. 3 is a cross sectional view of an IC chip formed using the extremely thin substrate according to example 1.

FIG. 3 is a cross sectional view of an IC chip of as extremely thin as 50 µm obtained using the substrate obtained in the above method. The device is formed in a 5-µm thick epitaxial Si layer. In order to improve the bending strength of the extremely thin substrate, the back surface is processed into mirror. The IC chip includes a source/drain region 6, a device isolation region 7, a gate electrode 8, an interlayer insulation film 9, a metal wiring line 10, and a passivation film 11.

Figure 4:
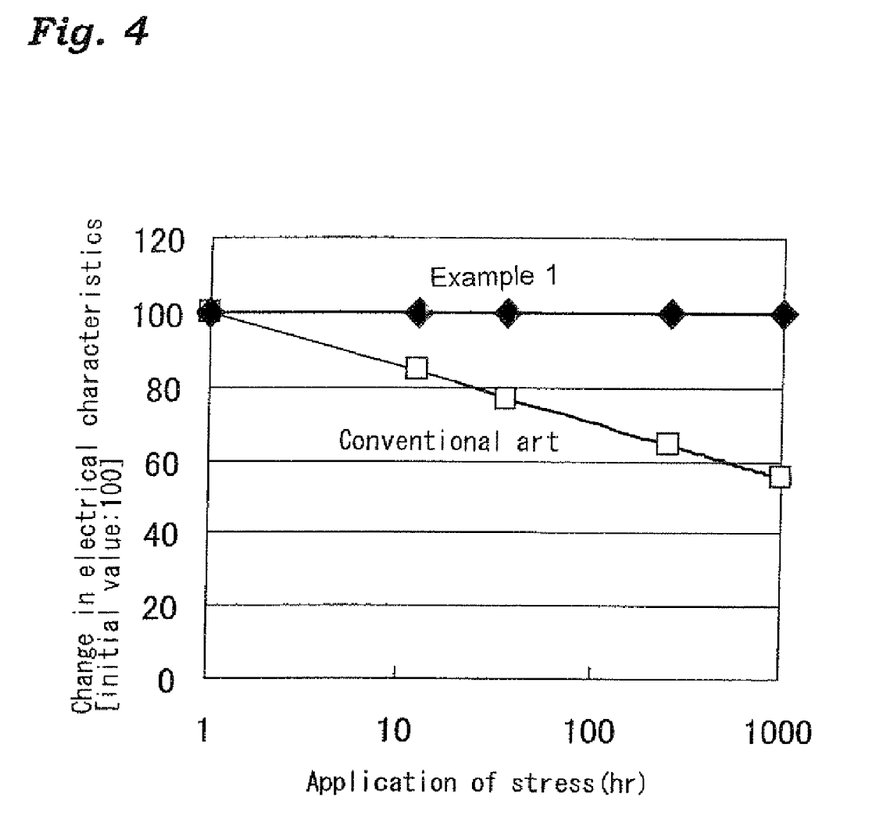
FIG. 4 is a diagram showing the variation of an electrical characteristic of the IC chip formed using the extremely thin substrate according to example 1.

FIG. 4 is a diagram showing the variation of an electrical characteristic of the IC chip formed using the extremely thin substrate, the back surface is processed into mirror, according to example 1. Referring to FIG. 4, in the case of the conventional technique where no gettering site for metal impurities is formed immediately under the device forming region, the electrical characteristic of the device fluctuates, while the present example provides an extremely thin IC chip without fluctuation of the electrical characteristic of the device. (Example 2)

Example 2 relates to a method for forming a Si crystal distortion to serve as a gettering site for metal impurities immediately under a device forming region.

EXAMPLE 2-1

Figure 5:
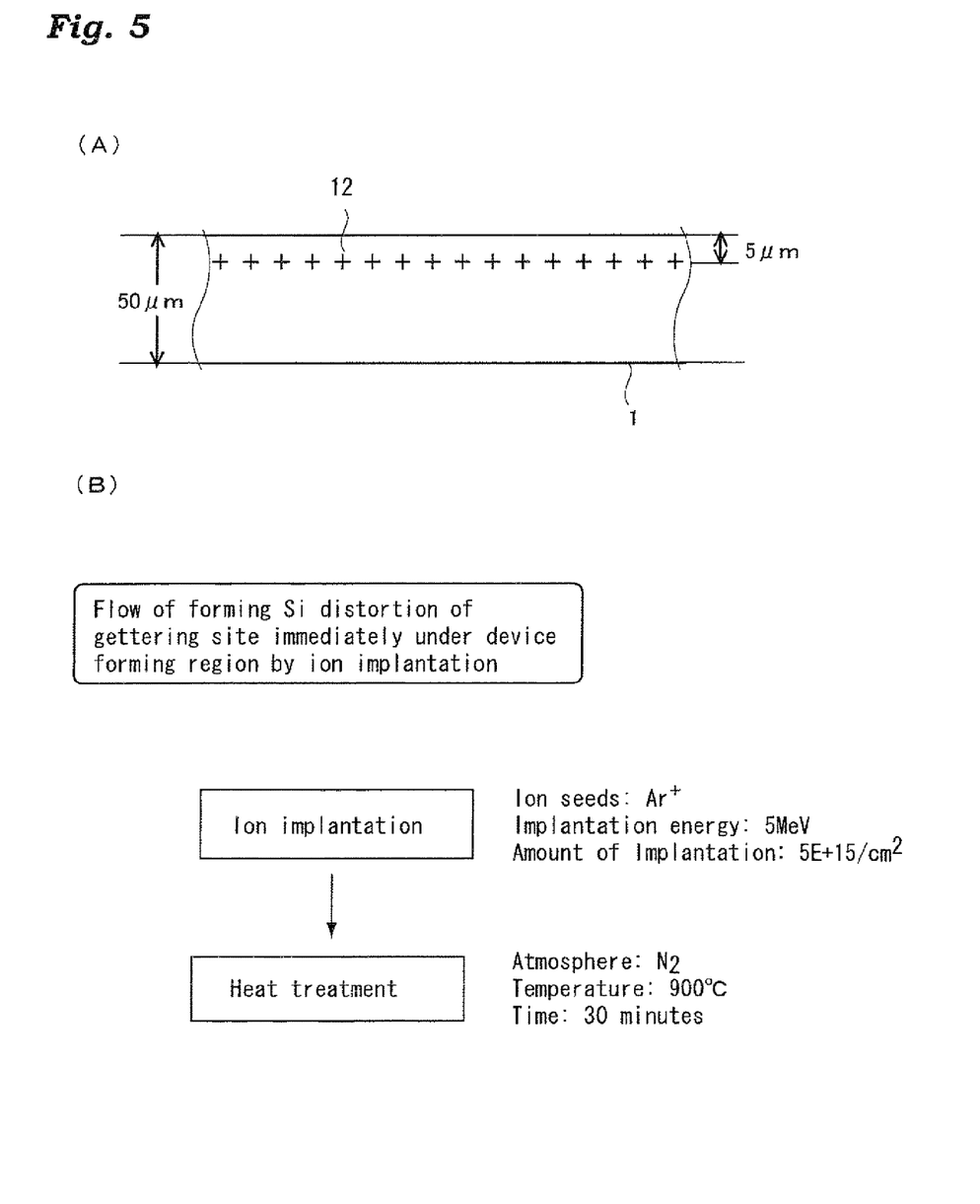
FIG. 5(A) is a cross sectional view of an extremely thin substrate according to example 2-1 in which a Si distortion is formed.
FIG. 5(B) is a flowchart of an exemplary step of forming the Si distortion of a gettering site according to example 2-1.

Referring to FIG. 5(A), an ion plantation of the inactive element Ar is carried out at a high energy of 5 MeV in a dose of approximately $5E+15/cm^2$ to the silicon semiconductor substrate 1, thereby forming a Si crystal distortion 12 at the depth of approximately 5 µm from the substrate surface and immediately under the device forming region. In order to promote recrystallization of the Si that has been turned into amorphousness by the ion plantation, heat treatment is carried out at 900° C. for approximately 30 minutes in the nitrogen atmosphere. This enables it to form the Si crystal distortion 12 to serve as the gettering site for metal impurities immediately under the device forming region.

FIG. 5(B) shows the flow of example 2-1.

EXAMPLE 2-2

Figure 6:
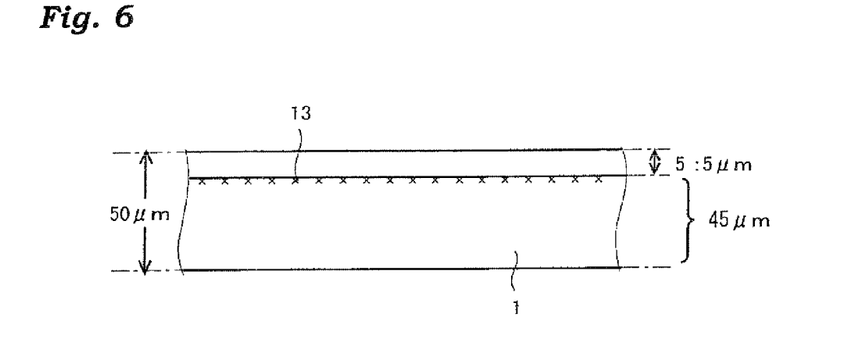
FIG. 6 is a cross sectional view of an extremely thin substrate according to example 2-2 in which a Si distortion is formed.

Referring to FIG. 6, at the depth of approximately 0.2 µm from the surface of the silicon semiconductor substrate 1, an ion plantation of the inactive element Ar is carried out at a high energy of 200 keV in a dose of approximately $5E+15/cm^2$. Then, heat treatment is carried out at 800° C. for approximately 20 minutes, in the nitrogen atmosphere, thereby removing the Si crystal distortion on the upper most surface of the silicon semiconductor substrate 1. Next, on the substrate 1, a 5-µm thick epitaxial Si layer 5 is grown. This enables it to a crystal distortion 13 to serve as a gettering site immediately under the device forming region. If a silicon substrate is stuck on the silicon semiconductor substrate 1 instead of growing the epitaxial. Si layer 5 thereon to form the device forming region, the crystal distortion 13 to serve as the gettering site can be formed immediately under the device forming region.

EXAMPLE 2-3

Figure 7:
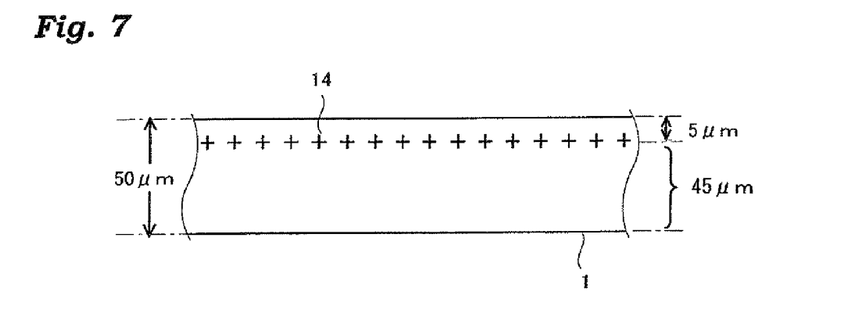
FIG. 7 is a cross sectional view of an extremely thin substrate according to example 2-3 in which a Si distortion is formed.

Referring to FIG. 7, to the silicon semiconductor substrate 1, a pulse radiation is carried out with a YAG laser with a high absorption coefficient with respect to Si, thereby enabling it to form a crystal distortion 14 to serve as a gettering site immediately under the device forming region. By selecting the laser power, laser beam diameter, and focal distance of laser beam, the Si crystal distortion 14 is formed at the depth of approximately 5 µm from the substrate surface and immediately under the device forming region.

EXAMPLE 2-4

Figure 8:
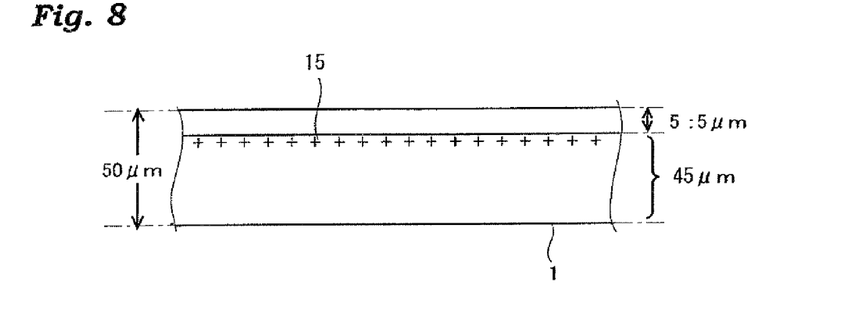
FIG. 8 is a cross sectional view of an extremely thin substrate according to example 2-4 in which a Si distortion is formed.

Referring to FIG. 8, a Si crystal distortion 15 is formed at the depth of approximately 0.2 µm from the surface of the silicon semiconductor substrate 1 by selecting the laser power, laser beam diameter, and focal distance of laser beam of a YAG laser. Then, on the substrate 1, a 5-µm thick epitaxial Si layer 5 is grown. This enables it to form the crystal distortion 15 to serve as a gettering site immediately under the device forming region. If a silicon substrate is stuck on the silicon semiconductor substrate 1 instead of growing the epitaxial Si layer 5 thereon to form the device forming region, the crystal distortion 15 to serve as the gettering site can be formed immediately under the device forming region.

EXAMPLE 3

Example 3 relates to a method for forming a potential barrier to serve as a gettering site for metal impurities immediately under a device forming region.

Figure 9:
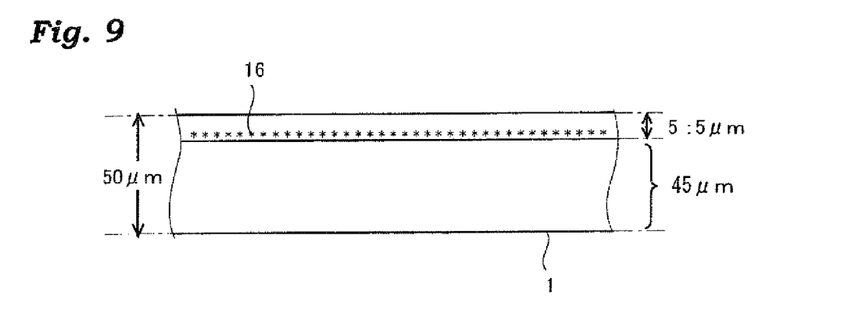
FIG. 9 is a cross sectional view of an extremely thin substrate according to example 3 in which a potential barrier is formed using an impurity layer of a different conductive type.
Figure 10:
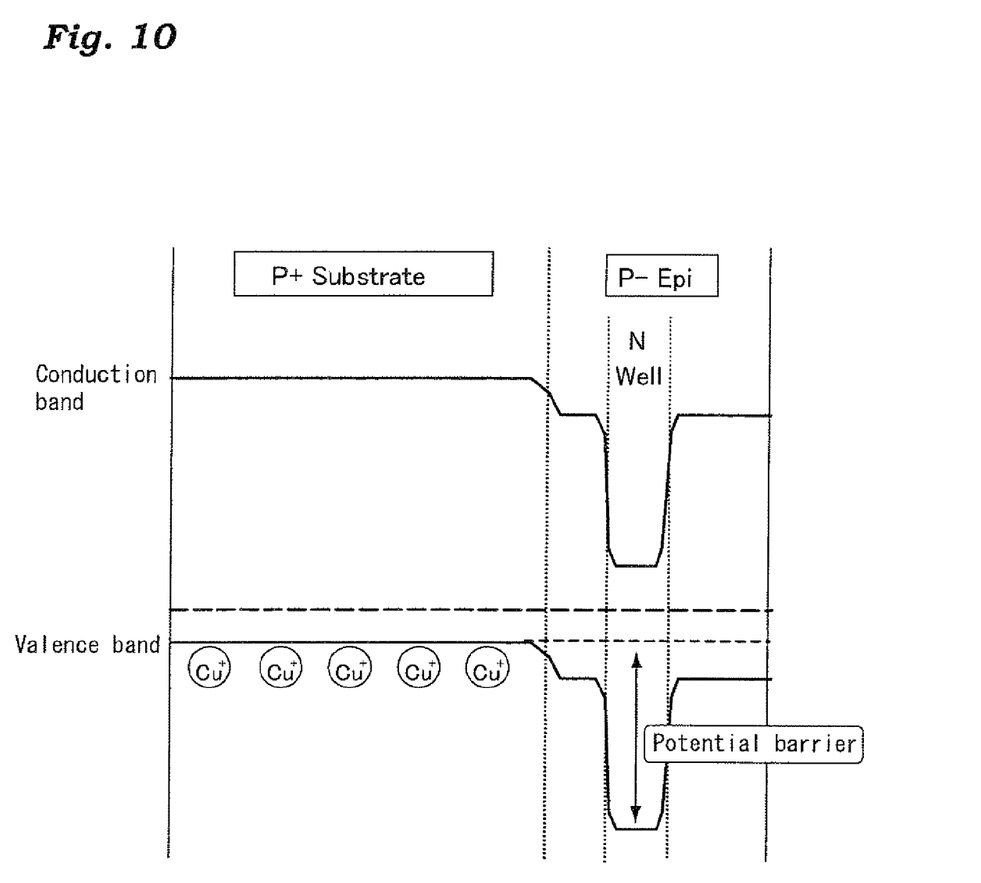
FIG. 10 is a diagram showing the potential in the cross sectional direction of the extremely thin substrate according to example 3.

Referring to FIG. 9, on a P-type silicon semiconductor substrate or the silicon semiconductor substrate 1, a P-type epitaxial Si layer 5 is grown. Then, an ion plantation of an N-type impurity (P) is carried out at a high energy of 3 MeV in a dose of approximately $5E+12/cm^2$, and heat treatment is carried out at 1100° C. for approximately 30 minutes, thereby forming an N-type impurity diffusion layer 16 at the depth of approximately 4 µm from the wafer surface. By this method, a potential barrier is formed as shown in FIG. 10. Metal impurities (e.g., Cu+) cannot get over the potential barrier. Accordingly, metal impurities do not influence the device forming region.

Although above examples exemplified the case the total thickness of the substrate was 50 µm, the present invention be is not limited to the thickness. Similar advantageous effects to those in the examples can be obtained if aspect(s) of the present invention is (are) applied to a substrate with a total thickness of within 100 µm.

The Embodiments herein described are to be considered in all respects as illustrative and not restrictive. The scope of the invention should be determined not by the Embodiments illustrated, but by the appended claims, and all changes which come within the meaning and range of equivalency of the appended claims are therefore intended to be embraced therein.

INDUSTRIAL APPLICABILITY

The present invention can be used for devices wherein thin device chips is required or can be used for devices wherein extreme thin device chips is required such as IC cards.

What is claimed is:

1. A semiconductor device comprising a semiconductor substrate having a surface and a back surface, wherein:
   a device forming region is within the depth of approximately equal to or less than 5 μm from the surface of the semiconductor substrate, a total thickness of the semiconductor substrate being from 5 μm to 100 μm;
   a gettering site for carrying out gettering of metal impurities is provided immediately under the device forming region; and
   an IC chip formed on the surface of the semiconductor substrate,
   wherein nothing is formed on the back surface of the semiconductor substrate.

2. The semiconductor device according to claim 1, wherein the gettering site is formed of a bulk micro defect, a crystal distortion, or an impurity of a conductive type opposite to that of the device.

3. The semiconductor device according to claim 1, wherein a total thickness of the semiconductor substrate is equal to or less than 50 μm.

4. The semiconductor device according to claim 1, wherein the gettering site is formed as a potential barrier arranged to prevent the metal impurities from influencing the device forming region.

5. The semiconductor device according to claim 1, wherein the semiconductor device does not include another semiconductor substrate stacked onto the semiconductor substrate.

6. An IC card comprising a semiconductor substrate having a surface and a back surface, wherein:
   a device forming region is within the depth of approximately equal to or less than 5 μm from the surface of the semiconductor substrate, a total thickness of the semiconductor substrate being from 5 μm to 100 μm;
   a gettering site for carrying out gettering of metal impurities is provided immediately under the device forming region; and
   an IC chip formed on the surface of the semiconductor substrate,
   wherein nothing is formed on the back surface of the semiconductor substrate.

7. The IC card according to claim 6, wherein a total thickness of the semiconductor substrate is equal to or less than 50 μm.

8. The IC card according to claim 6, wherein the gettering site is formed as a potential barrier arranged to prevent the metal impurities from influencing the device forming region.

9. The IC card according to claim 6, wherein the IC card does not include another semiconductor substrate stacked onto the semiconductor substrate.

* * * * *